(12) United States Patent
Cheng et al.

(10) Patent No.: US 10,559,504 B2
(45) Date of Patent: Feb. 11, 2020

(54) HIGH MOBILITY SEMICONDUCTOR FINS ON INSULATOR

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/900,479

(22) Filed: Feb. 20, 2018

(65) Prior Publication Data

US 2019/0259672 A1   Aug. 22, 2019

(51) Int. Cl.
| | |
|---|---|
| *H01L 21/84* | (2006.01) |
| *H01L 27/12* | (2006.01) |
| *H01L 21/02* | (2006.01) |
| *H01L 21/762* | (2006.01) |
| *H01L 29/06* | (2006.01) |

(52) U.S. Cl.
CPC ...... *H01L 21/845* (2013.01); *H01L 21/02381* (2013.01); *H01L 21/02546* (2013.01); *H01L 21/76224* (2013.01); *H01L 27/1211* (2013.01); *H01L 29/0649* (2013.01)

(58) Field of Classification Search
CPC ............. H01L 21/845; H01L 21/02381; H01L 21/02546; H01L 21/76224; H01L 27/1211; H01L 29/0649

USPC .................................................. 257/401, 438
See application file for complete search history.

(56) References Cited

U.S. PATENT DOCUMENTS

| | | | |
|---|---|---|---|
| 8,624,326 | B2 | 1/2014 | Chen et al. |
| 8,628,989 | B2 | 1/2014 | Lochtefeld |
| 8,937,299 | B2 | 1/2015 | Basu et al. |
| 9,466,690 | B1 | 10/2016 | Balakrishnan et al. |
| 9,476,143 | B2 | 10/2016 | Vincent et al. |
| 9,716,030 | B2 | 7/2017 | Leobandung |
| 9,780,173 | B2 | 10/2017 | Cheng et al. |
| 2013/0034943 | A1 | 2/2013 | Lochtefeld |
| 2013/0099282 | A1 | 4/2013 | Chen et al. |
| 2013/0233238 | A1 | 9/2013 | Vincent et al. |
| 2014/0264446 | A1 | 9/2014 | Basu et al. |
| 2016/0141370 | A1 | 5/2016 | Cheng et al. |
| 2016/0351592 | A1 | 12/2016 | Leobandung |

*Primary Examiner* — Hrayr A Sayadian
(74) *Attorney, Agent, or Firm* — L. Jeffrey Kelly; Otterstedt, Wallace & Kammer, LLP

(57) ABSTRACT

High-mobility semiconductor fins are formed on an insulator layer using techniques allowing precise control of fin heights. Lattice-matched fins are grown epitaxially on sidewalls of an essentially defect-free portion of a semiconductor template. The fins are formed within laterally extending trenches in a top dielectric layer, the thickness of which determines fin height. The trenches extend orthogonally to the template. Epitaxial overgrowth above the top dielectric layer is removed by planarization. The fin template and top dielectric layer are removed, leaving sets of parallel fins on the insulator layer. The fin template can be replaced by an isolation region for electrically isolating sets of fins.

14 Claims, 12 Drawing Sheets

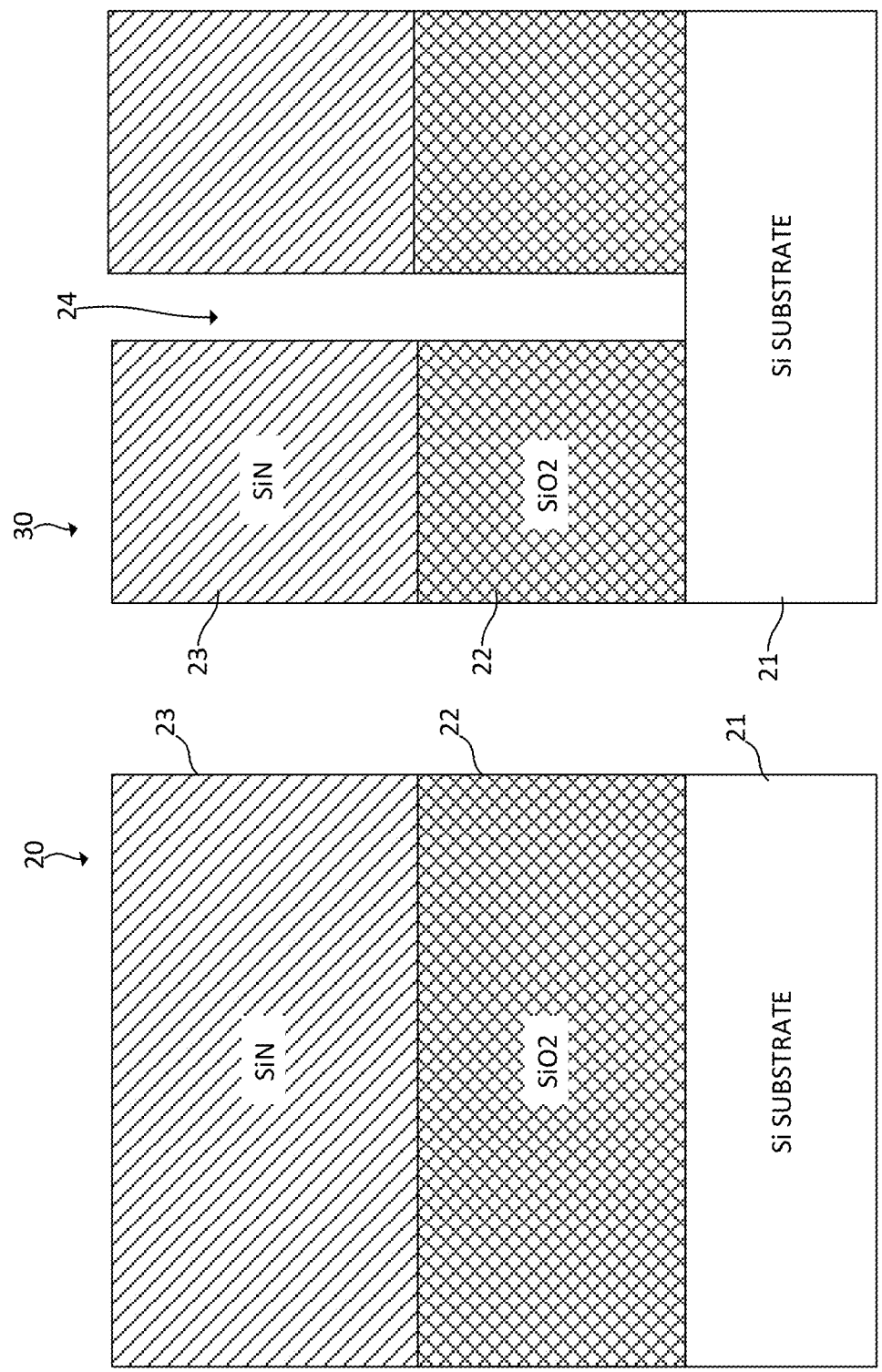

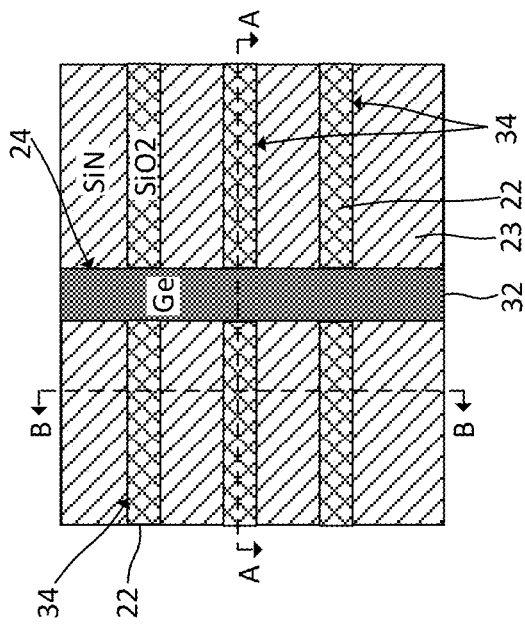
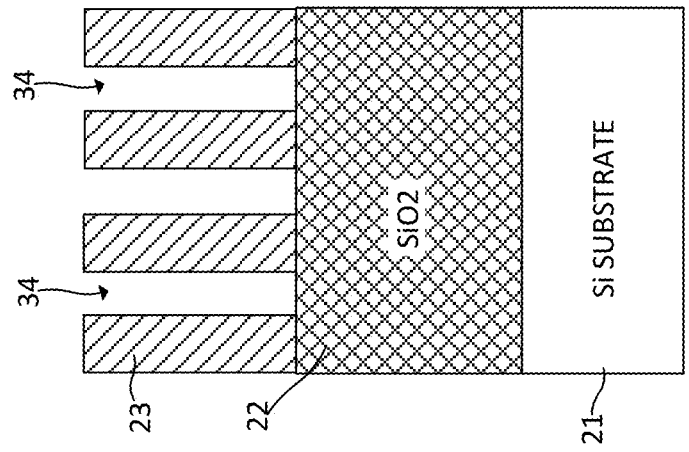
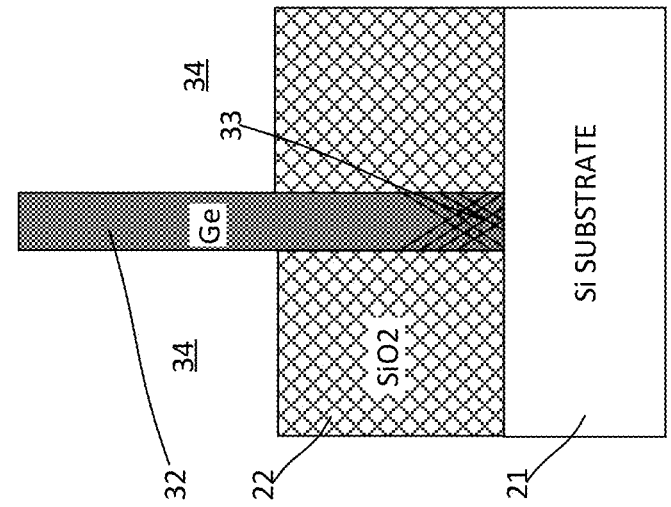
FIG. 4C
FIG. 4B
FIG. 4A

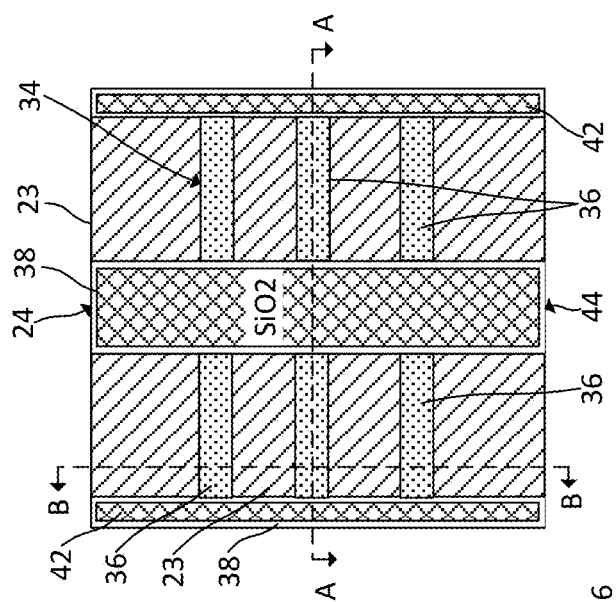
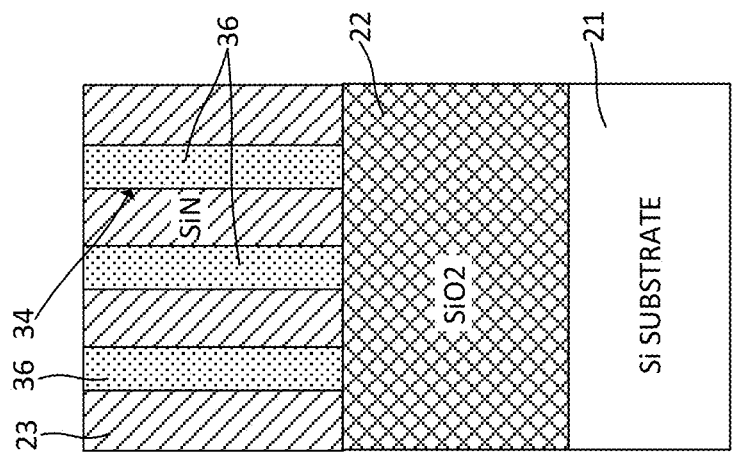
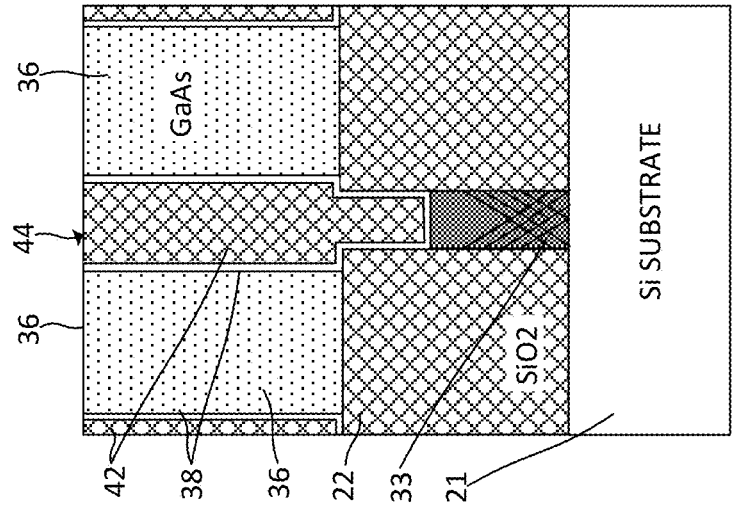

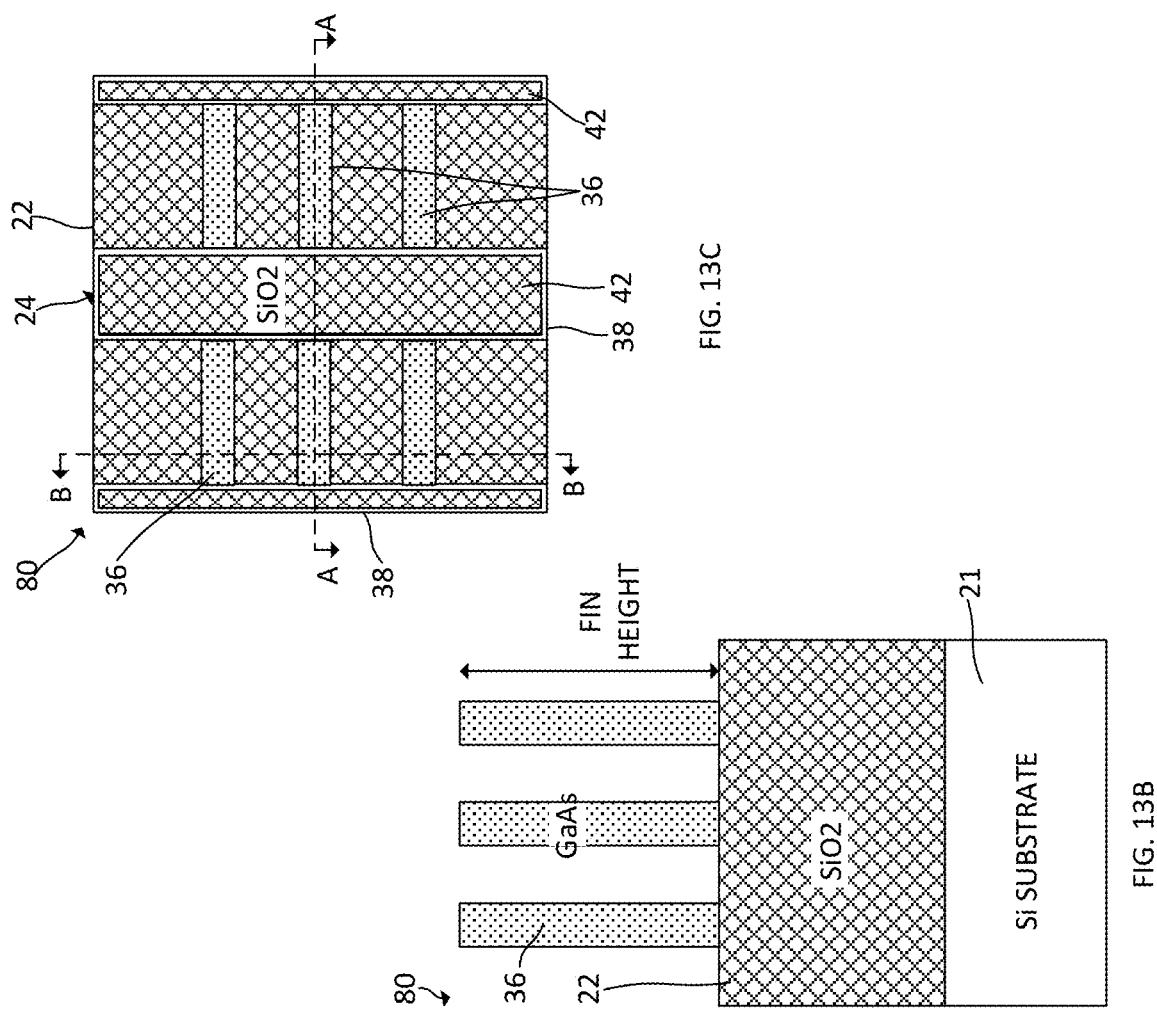

HIGH MOBILITY SEMICONDUCTOR FINS ON INSULATOR

BACKGROUND

The present invention relates generally to the electrical, electronic and computer arts and, more particularly, to the formation of finned semiconductor structures.

III-V compounds offer a number of advantages over silicon with respect to the operation of semiconductor devices such as field-effect transistors. The heterointegration of III-V compounds on materials such as silicon allows the co-integration of III-V nFETs with, for example, SiGe pFETs. III-V and CMOS is one possible option for sub-10 nm technology nodes.

The performance of devices fabricated using dissimilar semiconductor materials can be materially affected by defects that cause abrupt changes in electrical and/or optical properties. Adverse effects due to misfit defects and threading dislocations should be minimized or avoided in the fabrication of electronic devices incorporating such semiconductor materials. III-V semiconductors have larger lattice constants than silicon, so integrating them on silicon is challenging. Methods for integrating III-V semiconductors on silicon have included blanket III-V growth and aspect ratio trapping (ART). Blanket growth traps most of the misfit dislocations near the lattice mismatched interface, but threading dislocations still reach the surface semiconductor material. Defect densities can be in the 1e7 to 1e9/cm$^2$ range. The deposition of thick III-V layers is required when using the blanket deposition technique.

Aspect ratio trapping (ART) is an effective technique to trap threading dislocations, thereby reducing the dislocation density of lattice mismatched materials grown on silicon. The ART technique can be performed using thinner III-V layers. Trenches are employed for trapping misfit threading dislocations by stopping their propagation. The III-V material is grown in narrow trenches. Epitaxy defects are trapped at the bottoms of the trenches. Essentially defect-free fins can be formed in the upper portions of the trenches. Transistors can be formed using the defect-free portions of the fins.

BRIEF SUMMARY

A monolithic structure including high mobility semiconductor fins on an electrically insulating layer and fabrication of such a structure are aspects of inventions disclosed herein.

In one aspect, an exemplary method of fabricating a monolithic structure includes obtaining a first structure including a semiconductor substrate, a bottom dielectric layer on the substrate, a top dielectric layer on the bottom dielectric layer, a first trench extending vertically through the top dielectric layer and the bottom dielectric layer and exposing a top surface portion of the semiconductor substrate and an epitaxial semiconductor pillar within the first trench and directly on the exposed top surface portion of the semiconductor substrate. The method further includes forming a plurality of parallel second trenches extending vertically through the top dielectric layer and orthogonally with respect to the first trench, the second trenches including bottom ends adjoining the bottom dielectric layer and inner ends adjoining the semiconductor pillar. A plurality of semiconductor fins is grown directly on the semiconductor pillar such that the conductor fins extend laterally from the semiconductor pillar within the plurality of second trenches. The semiconductor fins adjoin the bottom dielectric layer. The semiconductor pillar is removed from at least a top portion of the first trench adjoining the top dielectric layer. At least the top portion of the first trench is filled with electrically insulating material.

In a further aspect, a monolithic structure includes a semiconductor substrate and a dielectric layer on the substrate. A first set of parallel semiconductor fins extends vertically from the top surface of the dielectric layer. A second set of parallel semiconductor fins extends vertically from the dielectric layer. Each of the semiconductor fins has an inner end portion. A trench extends vertically through the dielectric layer down to the semiconductor substrate. An isolation region comprising electrically insulating material extends orthogonally with respect to the first and second sets of parallel semiconductor fins. The isolation region includes a first portion extending beneath the top surface of the dielectric layer and into the trench and a second portion extending above the top surface of the dielectric layer. The second portion of the isolation region has a first sidewall adjoining the inner end portions of the first set of parallel semiconductor fins and a second sidewall adjoining the inner end portions of the second set of parallel semiconductor fins.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Formation of high-mobility semiconductor fins to avoid defects;
Precisely controlled semiconductor fin heights;
Semiconductor fins formed on electrical insulator to improve device isolation;
Electrical isolation of sets of semiconductor fins;
Enhanced reliability.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1 is a schematic, cross-sectional illustration of a monolithic structure including a bulk semiconductor substrate and a pair of dielectric layers;

FIG. 2 is a view of the structure shown in FIG. 1 following formation of a vertical trench;

FIG. 4A is a schematic, cross-sectional view taken along line A-A of FIG. 4C and showing the structure of FIG. 3A following formation of a second set of trenches;

FIG. 4B is a schematic, cross-sectional view taken along line B-B of FIG. 4C;

FIG. 4C is a top plan view of the structure shown in FIG. 4A;

FIG. 12A is a schematic, cross-sectional view taken along line A-A of FIG. 12C showing the structure of FIG. 11A following deposition of electrically insulating material;

FIG. 12B is a schematic, cross-sectional view taken along line B-B of FIG. 12C;

FIG. 12C is a top plan view of the structure shown in FIG. 12A;

FIG. 13A is a schematic, cross-sectional view taken along line A-A of FIG. 13C showing the structure of FIG. 12A following selective removal of the top dielectric layer;

FIG. 13B is a schematic, cross-sectional view taken along line B-B of FIG. 13C, and FIG. 13C is a top plan view of the structure shown in FIG. 13A.

Figure 3B:
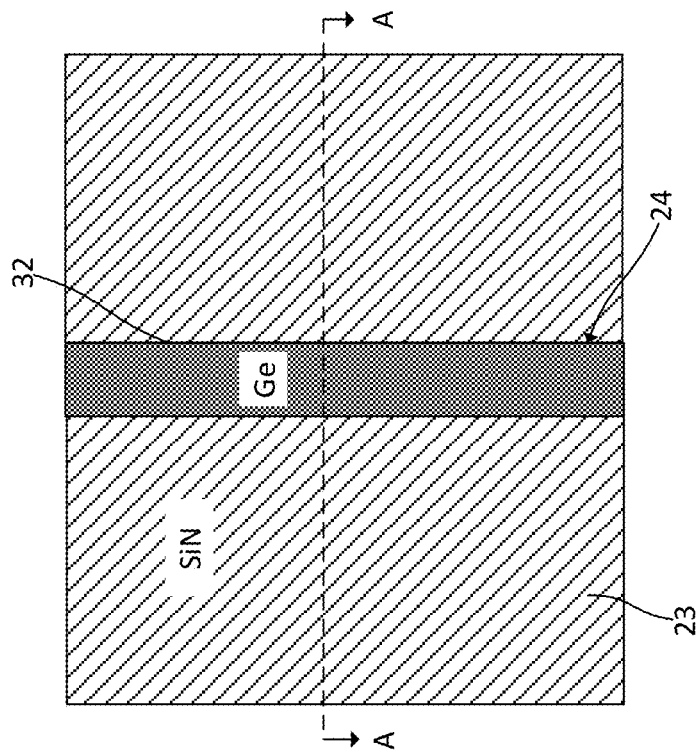
FIG. 3B is a top plan view of the structure shown in FIG. 3A.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A structure 20 including a bulk semiconductor substrate 21 comprised of crystalline silicon is shown in FIG. 1. The substrate may be in the form of a wafer that is essentially undoped. The substrate may alternatively be comprised of material(s) other than silicon. Dielectric layers are deposited sequentially on the substrate. In an exemplary embodiment, the bottom dielectric layer is a silicon dioxide layer 22 and the top layer is a silicon nitride layer 23. Other dielectric layers may alternatively be employed for forming one or both sacrificial layers. The bottom dielectric layer can later function as an etch stop layer due to the etch selectivity of SiN over $SiO_2$. In one or more embodiments, plasma enhanced chemical vapor deposition (PECVD) is used to deposit the silicon dioxide layer 22. Deposition techniques such as spin-on coating, CVD, plasma-assisted CVD, and other known techniques may be employed for forming the silicon nitride layer 23 as a blanket layer. The thickness of the top dielectric layer is uniform and corresponds to the desired thickness of the semiconductor fins formed later in the process. In some embodiments, the thickness of the top dielectric layer 23 is between about ten and seventy nanometers (10-70 nm). This thickness should be considered exemplary as opposed to limiting. The top dielectric layer 23 may be planarized to obtain the monolithic structure 20 shown in FIG. 1.

The dielectric layers 22, 23 are patterned to form a first set of trenches 24, one of which is shown in the figures. An etching process such as a reactive ion etch (ME) may be employed following deposition of a patterned mask (not shown) to obtain trenches 24 having substantially vertical side walls and extending down to the top surface of the substrate 21. The width of each trench 24 is between about 5 nm and 20 nm, though this range should be considered exemplary as opposed to limiting. One or more etchants may be employed to form the trenches through both dielectric layers 22, 23. A structure 30 as schematically illustrated in FIG. 2 is thereby obtained.

Figure 3A:
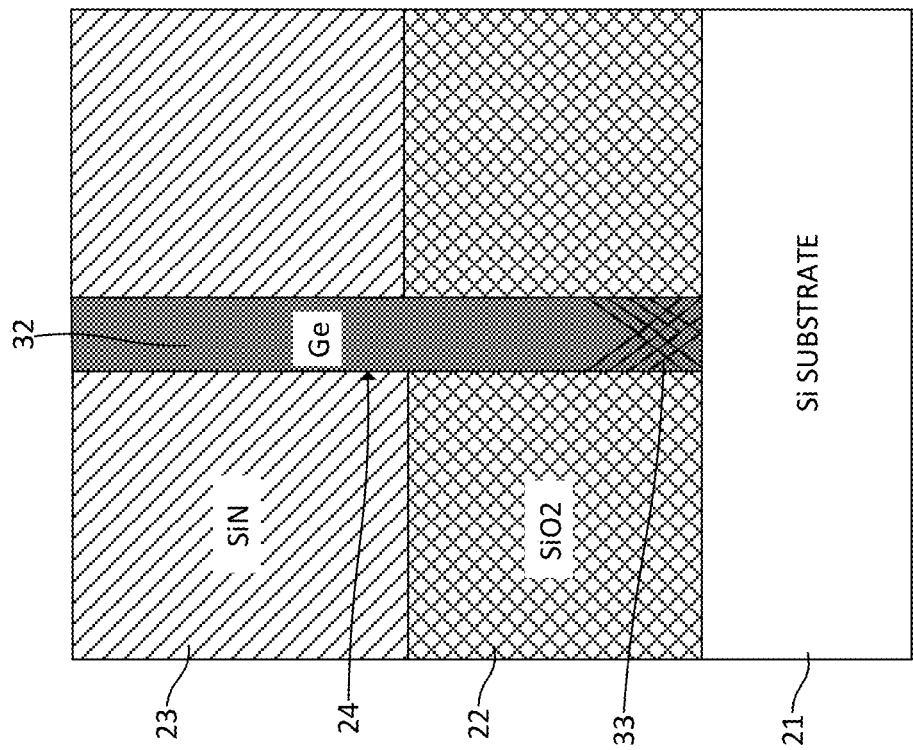
FIG. 3A is a schematic, cross-sectional view taken along line A-A of FIG. 3B showing the structure following epitaxial growth of a sacrificial semiconductor layer on the substrate.

Referring to FIGS. 3A and 3B, a sacrificial semiconductor material is epitaxially grown on the exposed surfaces of the substrate 21, forming vertical pillars 32 within the trenches 24. The terms "epitaxial growth and/or deposition" and "epitaxially formed and/or grown" mean the growth of a semiconductor material (crystalline material) on a deposition surface of another semiconductor material (crystalline material), in which the semiconductor material being grown has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The sacrificial semiconductor material grown on the substrate should be capable of being selectively etched with respect to the dielectric layers 22, 23 and the substrate. Germanium is deposited in some exemplary embodiments, though other materials such as silicon germanium and III-V compound semiconductors may alternatively be employed. The epitaxial deposition process may employ the deposition chamber of a chemical vapor deposition type apparatus, such as a low pressure chemical vapor deposition (LPCVD) and a metalorganic chemical vapor deposition (MOCVD) apparatus. A number of different precursors may be used for the epitaxial deposition of the sacrificial semiconductor material. A germanium gas source may, for example, be selected from the group consisting of germane, digermane, halogermane, dichlorogermane, trichlorogermane, tetrachlorogermane and combinations thereof. In embodiments where the deposited material includes silicon, the gas source may include silicon (Si) deposited from silane, disilane, trisilane, tetrasilane, hexachlorodisilane, tetrachlorosilane, dichlorosilane, trichlorosilane, disilane and combinations thereof. The temperature for epitaxial germanium and silicon germanium deposition typically ranges from 450° C. to 900° C. The aspect ratio (height to width) of each trench 24 is sufficient to cause epitaxial defects 33 within the sacrificial semiconductor material to be trapped in the bottom portions of the trenches beneath the top dielectric layer 23. The top portions of the pillars 32 formed from the sacrificial semiconductor material are bounded by the top dielectric layer and are essentially defect-free. Any overgrowth of the sacrificial semiconductor material above the top surface of the top dielectric layer 23 can be removed by polishing.

A second set of trenches 34 is formed within the top dielectric layer 23. The second set of trenches extends orthogonally with respect to the semiconductor pillar(s) 32 formed by the sacrificial semiconductor material (e.g. germanium). The second set of trenches can be formed using a dry etch process (e.g. a plasma containing $CH_3F$ and $O_2$) which selectively etch dielectric layer 23 with respect to dielectric layer 22. Thus, the top surface of the bottom dielectric layer 22 functions as an etch stop. The trenches 34 have widths corresponding to the desired widths of semiconductor fins that are formed later in the process. Trench widths in exemplary embodiments are in the range of about 5 nm to 20 nm, though other widths may be suitable for some application. FIGS. 4A-4C schematically illustrate the resulting structure. As best shown in FIGS. 4A and 4C, each pillar 32 comprised of the sacrificial semiconductor material has exposed vertical sidewall portions bounding each trench 34 following patterning of the top dielectric layer 23.

A III-V semiconductor material 35 (or a group IV material such as germanium or silicon germanium) is epitaxially grown on the exposed portions of the sidewalls of the essentially defect-free portions of the semiconductor pillar(s) 32 formed from the sacrificial semiconductor material. III-V compound semiconductors are obtained by combining group III elements (for example, Al, Ga, In) with group V elements (for example, N, P, As, Sb). GaAs, InGaAs, InP, GaP, and GaN are examples of III-V compound semiconductors. The exposed surfaces of the pillars 32 are cleaned if required to remove materials such as oxides that may be present prior to growth of the III-V material thereon. In one exemplary embodiment, GaAs is epitaxially grown on the essentially defect-free top portions of germanium (Ge) pillars. As GaAs and Ge have the same lattice constant, strain-induced defects are avoided in this embodiment. Various processes are familiar to those of skill in the art for epitaxially growing III-V semiconductor materials and group IV semiconductor materials on semiconductor substrates such as germanium and silicon germanium substrates. In the case of group III-V semiconductor materials, such processes include metalorganic chemical vapor deposition (MOCVD) and molecular beam epitaxy (MBE). Many different III-V compounds could be grown on the pillars depending upon the lattice constants of the pillar(s) 32 and III-V material 35 and the goal of avoiding strain-induced epitaxial defects in one or more embodiments. Accordingly multiple precursors could be used. Depending on which III-V material(s) or group IV material(s) is to be grown and which precursor is used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on germanium and on other semiconductor materials are well known in the art and new methods continue to be developed.

Figure 5C:
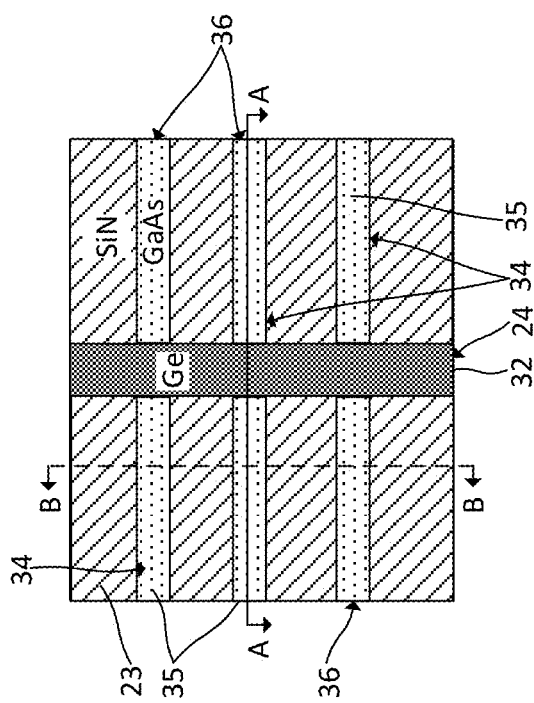
FIG. 5C is a top plan view of the structure shown in FIG. 5A.
Figure 5B:
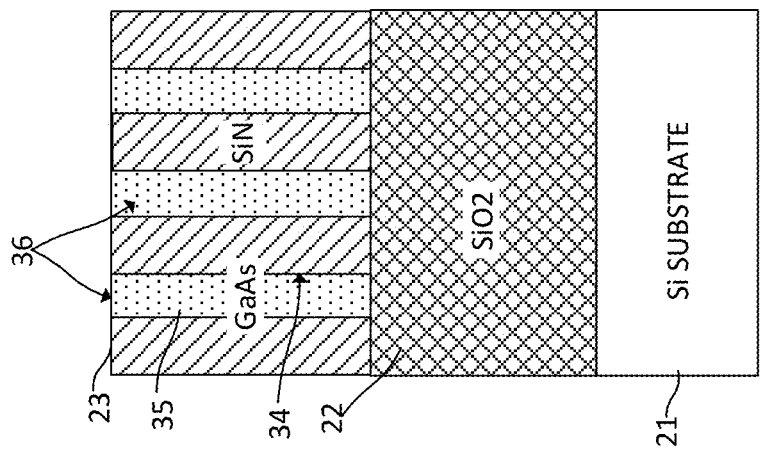
FIG. 5B is a schematic, cross-sectional view taken along line B-B of FIG. 5C.
Figure 5A:
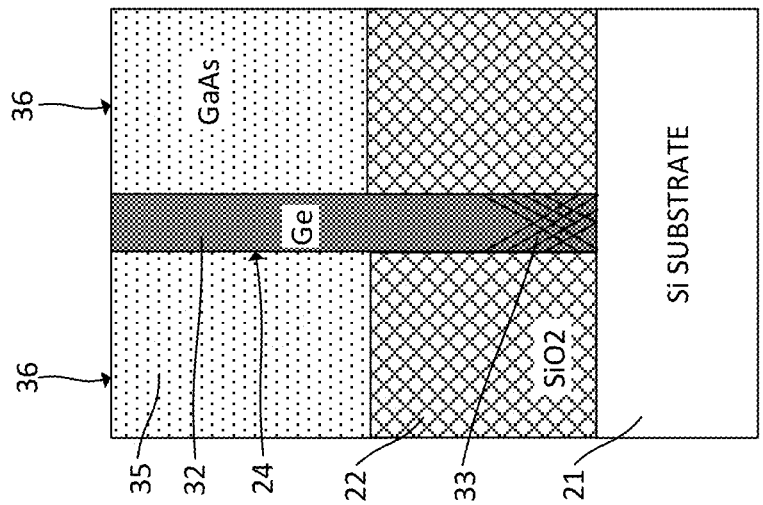
FIG. 5A is a schematic, cross-sectional view taken along line A-A of FIG. 5C and showing the structure of FIG. 4A following epitaxial growth of III-V semiconductor fins on the sidewalls of the sacrificial semiconductor layer.

The epitaxial III-V material (or alternatively group IV material) extends laterally with respect to the sidewalls of semiconductor pillar(s) and is confined by the walls bounding the second set of trenches 34. Overgrowth of the group III-V or group IV material can be removed by any suitable polishing technique, for example chemical mechanical planarization (CMP), stopping at the top surface of the top dielectric layer 23. Parallel III-V semiconductor fins 36 of equal width and height are accordingly formed in one or more embodiments with fin heights substantially matching the original thickness of the top dielectric layer. The bottoms of the fins 36 adjoin the top surface of the bottom dielectric layer 22, thereby facilitating device isolation. The lattice constants of the fin material and the sacrificial semiconductor material 32 can be the same or nearly the same. The spacing between fins 36 may be between 10 nm and 50 nm. FIGS. 5A-5C provide sectional and top plan views of an exemplary structure including a vertical germanium pillar 32 and GaAs fins 36 on an electrically insulating layer 22 and extending laterally from the sidewalls of the pillar.

Figure 6C:
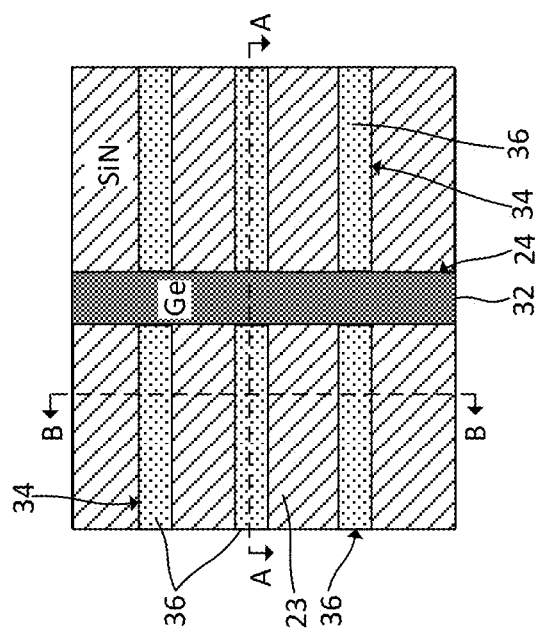
FIG. 6C is a top plan view of the structure shown in FIG. 6A.
Figure 6B:
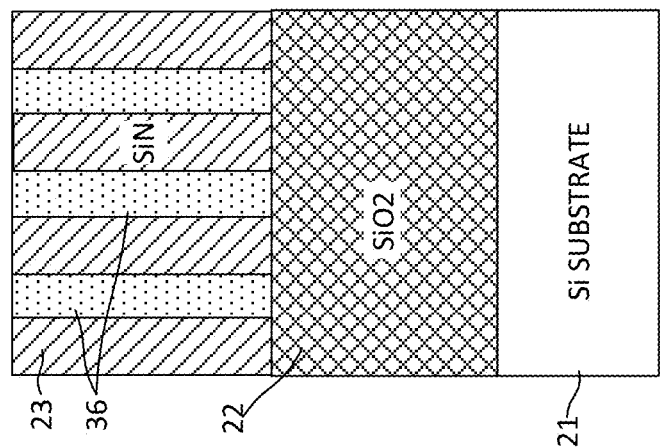
FIG. 6B is a schematic, cross-sectional view taken along line B-B of FIG. 6C.
Figure 6A:
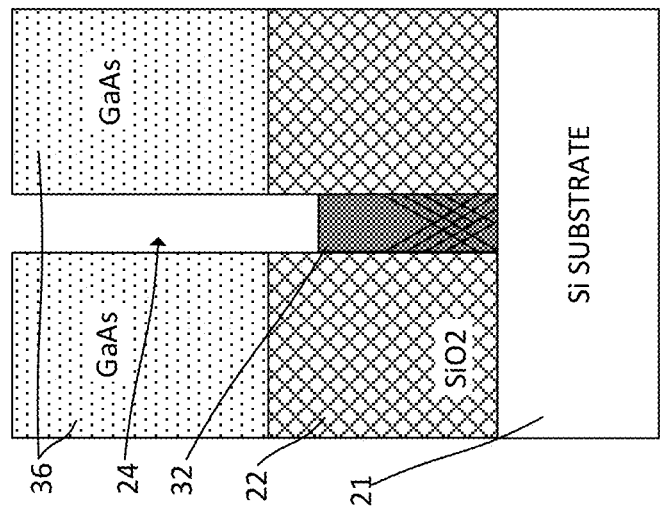
FIG. 6A is a schematic, cross-sectional view taken along line A-A of FIG. 6C showing the structure of FIG. 5A following partial removal of the sacrificial semiconductor layer.

Referring to FIGS. 6A-6C, the sacrificial semiconductor material (e.g. germanium) is etched selectively with respect to the fin material (e.g. GaAs) and the surrounding dielectric materials using a dry etch process (e.g. a plasma containing $CF_4$ and $O_2$) or a wet etch process (e.g. a solution containing hydrochloric acid). The sacrificial semiconductor material is completely removed from at least the portions of the trench (es) 24 above the top surface of the bottom dielectric layer 22. In some embodiments, residual portions of the sacrificial material pillar(s) 32 remain in the bottom portion(s) of the trench(es) 24 adjoining the bottom dielectric layer 22, as schematically illustrated in FIGS. 6A and 6C. The extent to which the sacrificial material is recessed does not need to be precisely controlled so long as it is no longer extends above the top surface of the bottom dielectric layer 22.

Figure 7C:
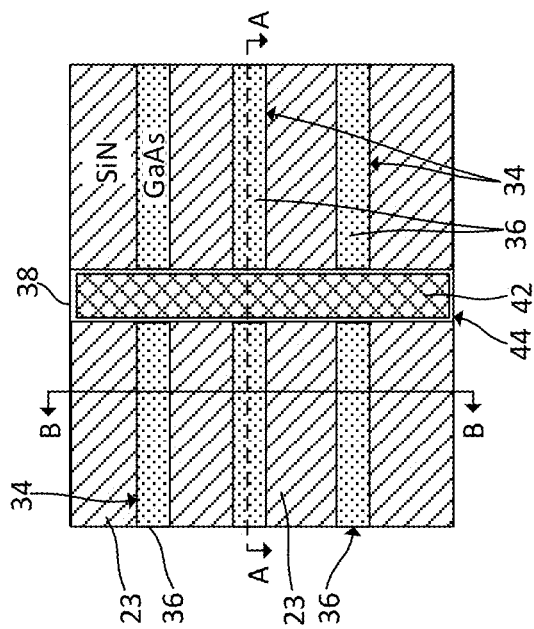
FIG. 7C is a top plan view of the structure shown in FIG. 7A.
Figure 7B:
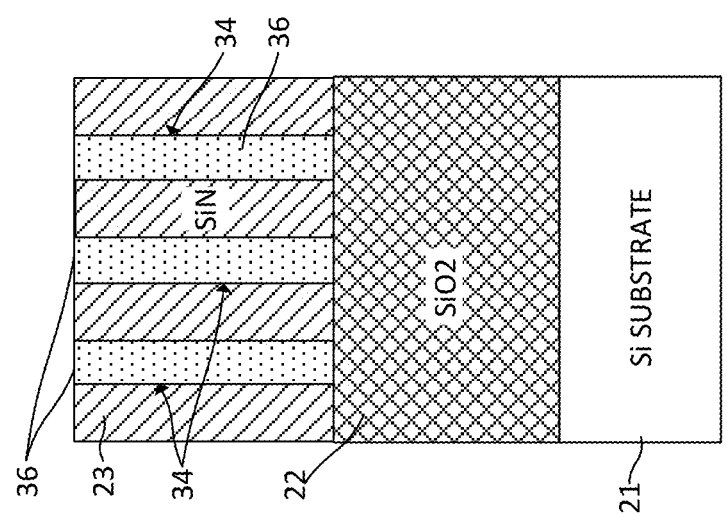
FIG. 7B is a schematic, cross-sectional view taken along line B-B of FIG. 7C.
Figure 7A:
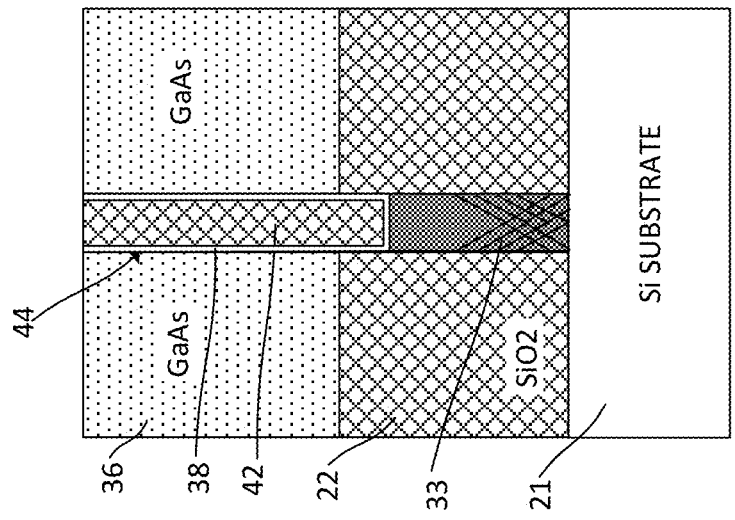
FIG. 7A is a schematic, cross-sectional view taken along line A-A of FIG. 7C showing the structure of FIG. 6A following deposition of electrically insulating material.

The trench(es) 24 are filled with electrically insulating material(s) to obtain a structure as shown in FIGS. 7A-7C. In an exemplary embodiment, a dielectric liner 38 is formed within each trench. The dielectric liner 38 can be deposited using directional deposition techniques including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The liner 38 may consist essential of SiBCN, SiOC, or other suitable material that will allow the later selective removal of the top (e.g. silicon nitride) dielectric layer 23. The trench(es) 24 are then filled with an oxide material 42 such as silicon dioxide or silicon oxycarbonitride (SiOCN). The deposited electrically insulating material(s) comprise shallow trench isolation (STI) region(s) 44 that electrically isolate sets of parallel III-V semiconductor fins.

Figure 8C:
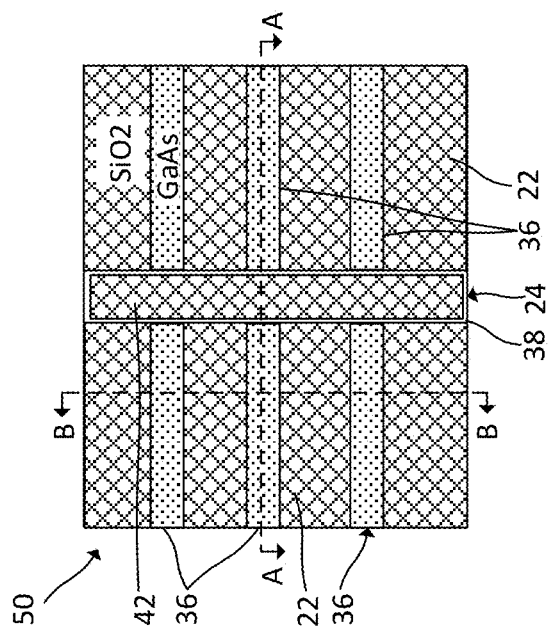
FIG. 8C is a top plan view of the structure shown in FIG. 8A.
Figure 8B:
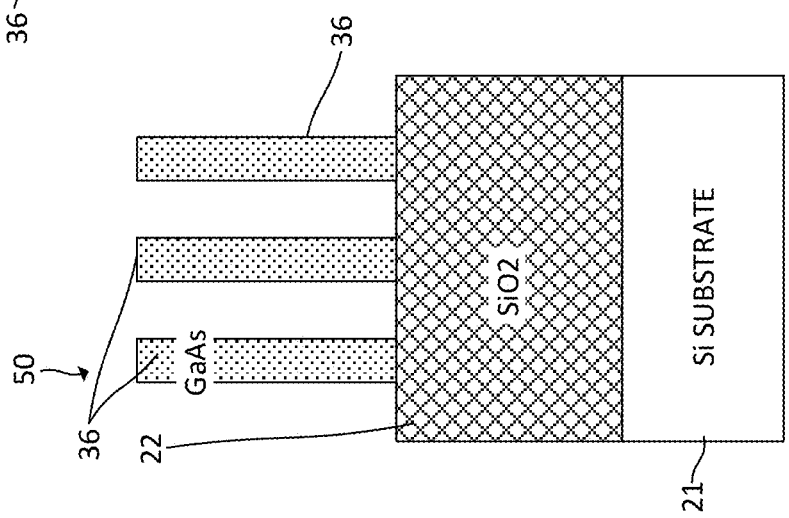
FIG. 8B is a schematic, cross-sectional view taken along line B-B of FIG. 8C.
Figure 8A:
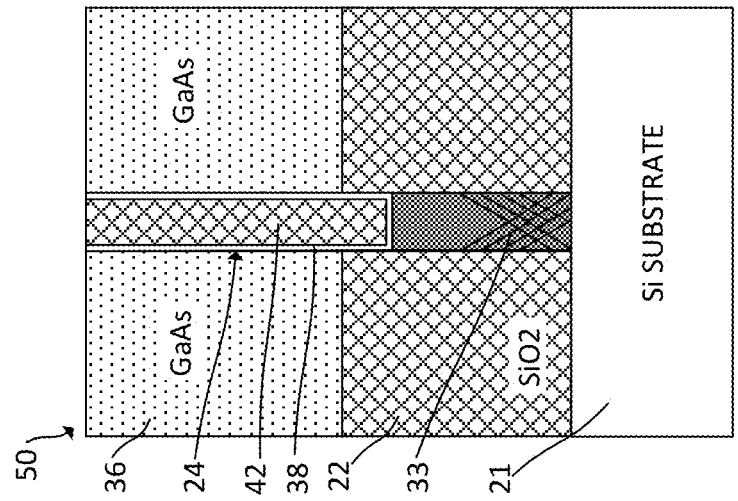
FIG. 8A is a schematic, cross-sectional view taken along line A-A of FIG. 8C showing the structure of FIG. 7A following selective removal of the top dielectric layer.

A selective etch process is employed to remove the top dielectric layer 23. If the top dielectric layer is a silicon nitride layer, it can be selectively removed either by wet etch (e.g., aqueous solution containing phosphoric acid) or dry etch (e.g., a plasma containing $CH_3F$ and $O_2$). A finned structure 50 as shown in FIGS. 8A-8C is obtained following the removal of the top dielectric layer. The exemplary structure 50 includes sets of parallel semiconductor fins 36, each fin consisting essentially of a group III-V semiconductor material such as GaAs. The fins include bottom ends adjoining an electrically insulating layer, for example a silicon dioxide layer 22. Sets of the semiconductor fins 36 are electrically isolated by a shallow trench isolation (STI) region 44 extending orthogonally with respect to the fins. The inner end portions of the fins adjoin the STI region. The STI region 44 may extend into the electrically insulating layer 22, as schematically illustrated in FIG. 8A. Fin height and STI region height above the electrically insulating layer are the same, both being formed using a sacrificial dielectric layer deposited as a blanket layer on the electrically insulating layer. In some embodiments, a residual portion of the pillar 32 of sacrificial semiconductor material extends between the STI region 44 and an underlying semiconductor substrate 21. The fin sidewalls are substantially vertical. The structure 50 is configured for allowing the formation of electronic devices such as field-effect transistors using portions of the semiconductor fins as channel regions.

Figure 9B:
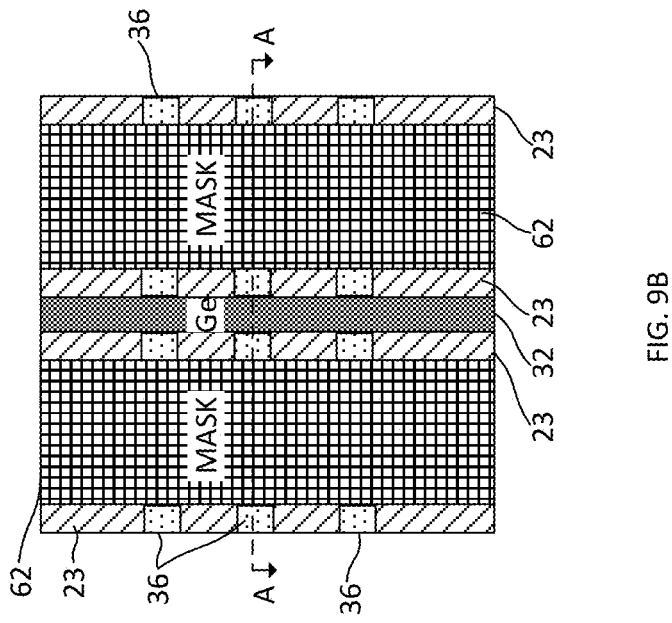
FIG. 9B is a top plan view of the structure shown in FIG. 9A.
Figure 9A:
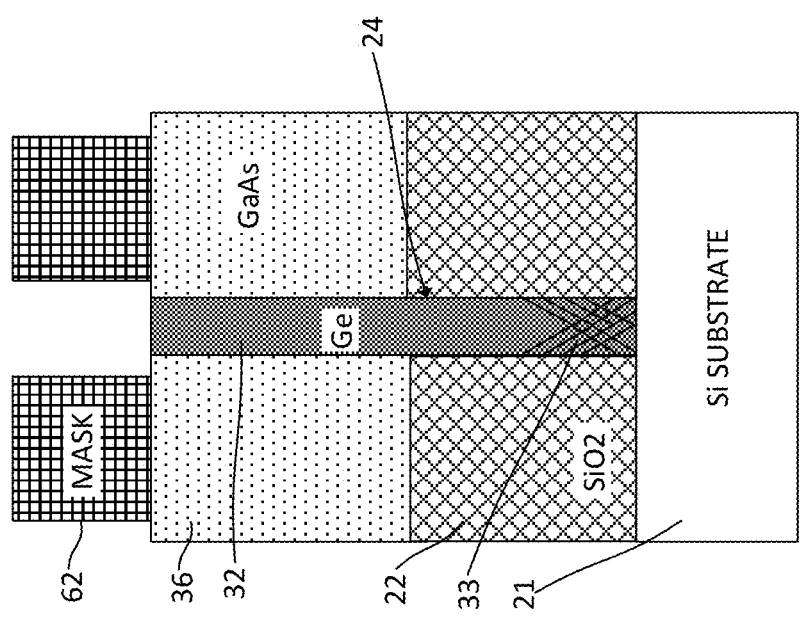
FIG. 9A is a schematic, cross-sectional view taken along line A-A of FIG. 9B showing the structure of FIG. 5A following deposition and patterning of a mask thereon.

An alternative fabrication process includes first obtaining a structure as schematically illustrated in FIGS. 5A-5C. The exemplary structure includes a germanium pillar and epitaxial GaAs fins 36 that extend laterally within trenches 34 from the sidewalls of the pillar. A patterned mask 62 is formed on the structure as shown in FIGS. 9A and 9B. Openings in the mask 62 expose the top surface of the germanium pillar, portions of the fins 36, and portions of the top dielectric layer 23. The width of each portion of the mask 62 corresponds to the desired fin width to be employed in fabricating an electronic device such as a fin-type field-effect transistor (FinFET).

Figure 10B:
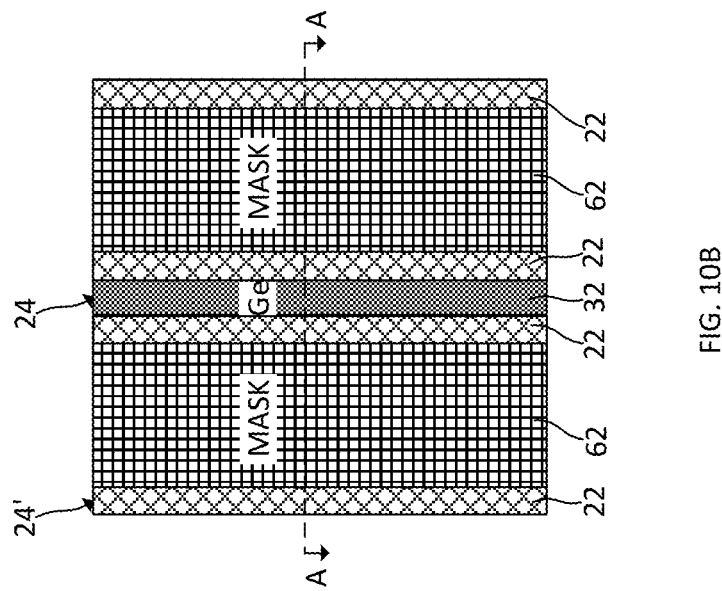
FIG. 10B is a top plan view of the structure shown in FIG. 10A.
Figure 10A:
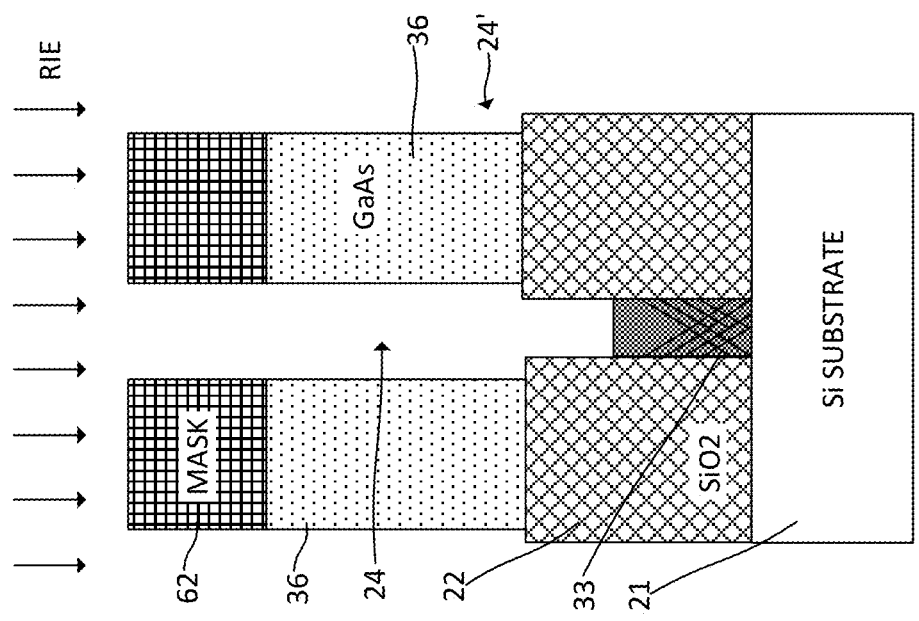
FIG. 10A is a schematic, cross-sectional view taken along line A-A of FIG. 10B showing the structure of FIG. 9A following a directional etch.
Figure 11C:
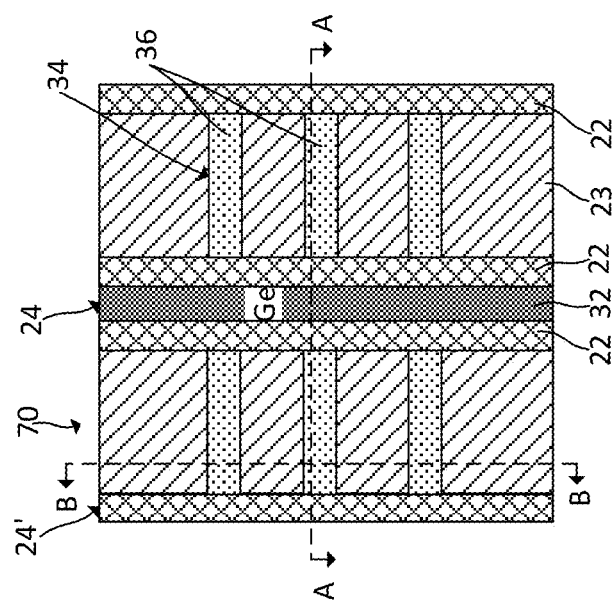
FIG. 11C is a top plan view of the structure shown in FIG. 11A.
Figure 11B:
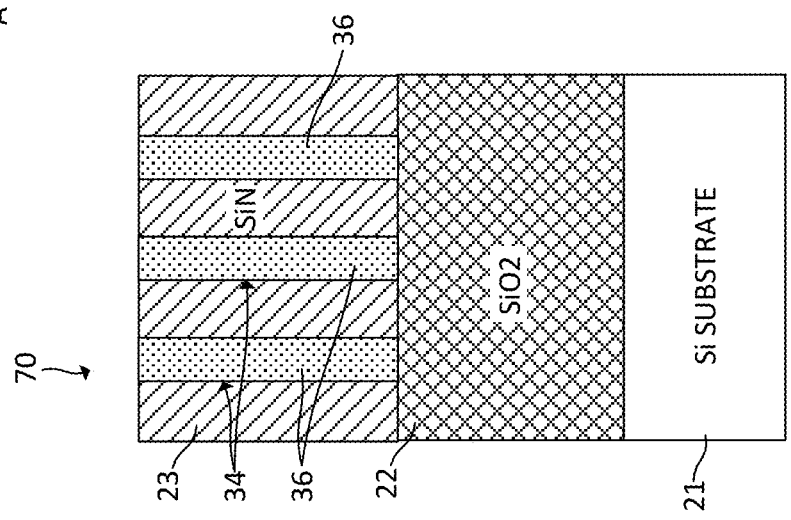
FIG. 11B is a schematic, cross-sectional view taken along line B-B of FIG. 11C.
Figure 11A:
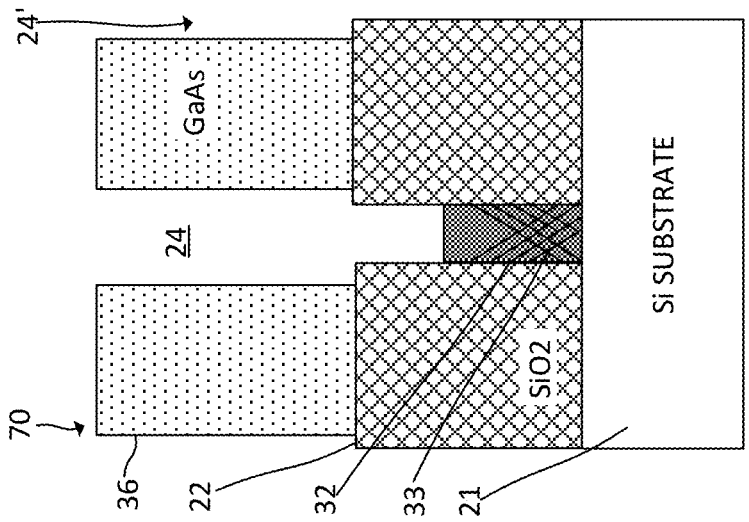
FIG. 11A is a schematic, cross-sectional view taken along line A-A of FIG. 11C showing the structure of FIG. 10A following removal of the patterned mask.

With the cut mask 62 in place, the structure is subjected to a directional etch (e.g. RIE) to remove the exposed III-V semiconductor fin portions, the exposed portions of the top dielectric layer 23, and at least the upper portion of the germanium pillar(s). The etch of the III-V material and the dielectric material between the exposed portions of the fins stops at the top surface of the bottom dielectric layer 22, which can function as an etch stop. The germanium etch can be deeper as long as it is recessed below the top surface of the first dielectric layer 22. As shown in FIGS. 10A and 10B, the width of the trench 24 is increased above the top surface of the bottom dielectric layer. The fins 36 include inner ends adjoining the trench 24 and outer ends adjoining recesses 24'. The mask 62 is removed to obtain the structure 70 shown in FIGS. 11A-11C.

Referring to FIGS. 12A-12C, the trench 24 and recesses 24' (shown in FIGS. 11A-11C) are filled with electrically insulating material. A dielectric liner 38 as described above may first be deposited followed by an oxide fill 42. The liner adjoins the inner and outer end portions of the fins 36 and the top surface of the residual sacrificial semiconductor layer 32. Excess dielectric material may be removed by CMP or other suitable process. The top dielectric layer 23 is then selectively removed to obtain the structure 80 schematically illustrated in FIGS. 13A-13C. Fin height may be the same as the thickness of the top dielectric layer 23 used during fin growth. Fin width is substantially the same as the width of the mask 62. Fin thickness is substantially the same as width of the trenches 34 formed in the top dielectric layer 23. The inner end surfaces of the fins 36 adjoin an STI region 44, the width of which is determined by an opening between portions of the patterned mask 62. Sets of parallel fins 36 are electrically isolated by the STI region. The location of the fins 36 on the bottom dielectric layer 22 facilitates device isolation.

By growing the III-V semiconductor fins laterally on vertical sidewalls of an essentially defect-free template such as the upper portion of a germanium pillar as disclosed above, there is no need to electrically isolate a defective bottom portion of a fin from an upper portion that is used to form a transistor. Strain-induced epitaxial defects are avoided by lattice matching the III-V material used to epitaxially grow the fins with the semiconductor material used as the template. Doping isolation of semiconductor fins formed using conventional ART processes may result in undesired dopant diffusion into the channel regions of the fins, causing variability in transistor characteristics. Such variability is avoided using the techniques disclosed herein, which do not require doping isolation.

A further advantage of the presently disclosed techniques is that fin height does not rely on the precise recessing of dielectric material. The dimensions of the channel portion of a semiconductor fin should be precisely controlled to minimize transistor variability. The practice of some conventional ART techniques involving recessing of a dielectric layer by a timed etch process can result in a variation of fin height. In contrast, by growing lateral, high-mobility III-V or silicon germanium or germanium semiconductor fins within trenches within a top dielectric layer and upon the top surface of a bottom dielectric layer, channel dimensions can be precisely controlled during fabrication. The techniques described herein facilitate the fabrication of high-mobility III-V fins and reduce or eliminate susceptibility of such fins to epitaxial defects. Once a finned substrate as described herein is obtained, elements such as doped source/drain regions can be epitaxially grown on the fins and gate stacks can be formed to obtain FinFET devices.

Electronic devices comprising the III-V or group IV semiconductor fins 36 may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a monolithic finned structure (50, 80) includes obtaining a first structure including a semiconductor substrate 21, a bottom dielectric layer 22 on the substrate, a top dielectric layer 23 on the bottom dielectric layer, a first trench 24 extending vertically through the top dielectric layer 23 and the bottom dielectric layer 22 and exposing a top surface portion of the semiconductor substrate 21, and an epitaxial semiconductor pillar 32 within the first trench and directly on the exposed top surface portion of the semiconductor substrate 21. An exemplary first structure is schematically illustrated in FIGS. 3A and 3B. A plurality of second trenches 34 are formed through the top dielectric layer and orthogonally with respect to the first trench 24. The second trenches include bottom ends adjoining the bottom dielectric layer 22 and inner ends adjoining the semiconductor pillar 32. Semiconductor fins 36 are grown directly on the semiconductor pillar such that they extend laterally from the semiconductor pillar 32 and within the plurality of second trenches 34. The semiconductor fins adjoin the bottom dielectric layer 22 as shown in FIGS. 5A and 5B. The semiconductor pillar is removed from at least a top portion of the first trench 24 adjoining the top dielectric layer, such as shown in FIG. 6A. At least the top portion of the first trench 24 is filled with electrically insulating material 38, 42, as shown for example in FIGS. 7A and 12A. The step of obtaining the first structure may include epitaxially growing the semiconductor pillar within the first trench and on the semiconductor substrate 21, trapping epitaxial defects 33 within a bottom portion of the semiconductor pillar below the top dielectric layer 23, and growing an essentially defect-free top portion of the semiconductor pillar above the bottom dielectric layer 22. The method may further include removing the top dielectric layer 23 following filling at least the top portion of the first trench 24 with electrically insulating material, such as shown in FIGS. 8B and 13B. Removal of the top dielectric layer exposes the semiconductor fins 36, the heights of which are the same as the thickness of the removed top dielectric layer. The deposition of the top dielectric layer 23 as a blanket layer having uniform thickness facilitates precise control of fin height. The electrically insulating material 38, 42 may fill at least part of a bottom portion of the first trench 24 adjoining the bottom dielectric layer, as schematically illustrated in FIGS. 7A and 8A. The electrically insulating material may be deposited over a residual portion of the semiconductor pillar 32. Overgrowth of the semiconductor fins 36 above the top dielectric layer 23 may be removed by planarization of the resulting structure down to the top surface of the top dielectric layer such that the heights of the semiconductor fins are equal to the thickness of the top dielectric layer. The semiconductor fins may be lattice matched to the semiconductor pillar to avoid strain-induced epitaxial defects. In some embodiments, the inner end portions and outer end portions of the fins are directionally etched down to the bottom dielectric layer, such as illustrated in FIG. 10A. A fin cut process allows the fins to be cut into a desired width prior to device (e.g. lateral and vertical FinFETs) fabrication. The semiconductor fins are grown using group III-V precursor materials in some embodiments and group IV precursor material(s) in other embodiments.

Further given the above discussion, a monolithic finned structure is provided for use in the fabrication of electronic devices. The structure includes a semiconductor substrate 21, a dielectric layer 22 on the substrate, and a first set of parallel semiconductor fins 36 extending vertically from the top surface of the dielectric layer. A second set of parallel semiconductor fins 36 also extends vertically from the top surface of the dielectric layer. The semiconductor fins have inner end portions. A trench 24 extends vertically through the dielectric layer down to the semiconductor substrate 21. An isolation region 44 comprising electrically insulating material and extends orthogonally with respect to the first and second sets of parallel semiconductor fins, the isolation region including a bottom portion extending beneath the top surface of the dielectric layer 22 and into the trench 24 and a top portion extending above the top surface of the dielectric layer. The top portion of the isolation region has a first sidewall adjoining the inner end portions of the first set of parallel semiconductor fins and a second sidewall adjoining the inner end portions of the second set of parallel semiconductor fins. FIGS. 8A-8C and 13A-13C schematically illustrate exemplary monolithic structures 50, 80. The inner end portions of the first and second sets of parallel semiconductor fins may be in opposing relation to each other, as shown in FIG. 8C. The monolithic structure may further including a semiconductor pillar 32 within the trench 24 and directly on and epitaxial to the semiconductor substrate 21. The semiconductor fins and the semiconductor pillar may consist essentially of lattice-matched semiconductor materials such as gallium arsenide and germanium, respectively. The width of the isolation region 44 exceeds the width of the trench 44 in some embodiments, as exemplified by the structure shown in FIG. 13A.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FinFETs or other devices therein.

An integrated circuit in accordance with aspects of the present disclosure can be employed in essentially any application and/or electronic system where the use of lateral or vertical FinFETs having high-mobility channels would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a monolithic structure including parallel semiconductor fins, comprising:
   obtaining a first structure including:
      a semiconductor substrate;
      a bottom dielectric layer on the substrate;
      a top dielectric layer on the bottom dielectric layer;
      a first trench extending vertically through the top dielectric layer and the bottom dielectric layer and exposing a top surface portion of the semiconductor substrate; and
      an epitaxial semiconductor pillar within the first trench and directly on the exposed top surface portion of the semiconductor substrate;
   forming a plurality of parallel second trenches extending vertically through the top dielectric layer and orthogonally with respect to the first trench, the second trenches including bottom ends adjoining the bottom dielectric layer and inner ends adjoining the semiconductor pillar;
   epitaxially growing a plurality of semiconductor fins directly on the semiconductor pillar such that the semiconductor fins extend laterally from the semiconductor pillar within the plurality of second trenches, the semiconductor fins adjoining the bottom dielectric layer;
   removing the semiconductor pillar from at least a top portion of the first trench extending vertically through the top dielectric layer; and
   filling at least the top portion of the first trench with electrically insulating material.

2. The method of claim 1, wherein obtaining the first structure includes:
   epitaxially growing the semiconductor pillar within the first trench and on the semiconductor substrate;
   trapping epitaxial defects within a bottom portion of the semiconductor pillar below the top dielectric layer; and
   growing an essentially defect-free top portion of the semiconductor pillar above the bottom dielectric layer.

3. The method of claim 2, further including removing the top dielectric layer following filling at least the top portion of the first trench with electrically insulating material.

4. The method of claim 3, wherein filling at least the top portion of the first trench with electrically insulating material further includes filling at least part of a bottom portion of the first trench extending vertically through the bottom dielectric layer.

5. The method of claim 4, wherein filling at least the top portion of the first trench with electrically insulating material further includes depositing the electrically insulating material over a residual portion of the semiconductor pillar that remains following removing the semiconductor pillar from at least the top portion of the first trench.

6. The method of claim 5, wherein the semiconductor substrate comprises silicon and the semiconductor fins consist essentially of group III-V semiconductor material.

7. The method of claim 6, wherein the semiconductor pillar consists essentially of germanium and the semiconductor fins are latticed matched to germanium.

8. The method of claim 2, wherein:
   obtaining the first structure further includes depositing the top dielectric layer as a blanket layer having uniform thickness;
   epitaxially growing the plurality of semiconductor fins further includes causing the plurality of semiconductor fins to overgrow the plurality of second trenches; and
   further including planarizing portions of the semiconductor fins down to the top dielectric layer such that the heights of the semiconductor fins are equal to the thickness of the top dielectric layer.

9. The method of claim 8, further including removing the top dielectric layer following filling at least the top portion of the first trench with electrically insulating material.

10. The method of claim 9, wherein filling at least the top portion of the first trench with electrically insulating material further includes filling at least part of a bottom portion of the first trench extending vertically through the bottom dielectric layer.

11. The method of claim 9, wherein the semiconductor fins consist essentially of group III-V semiconductor material and are lattice matched to the semiconductor pillar.

12. The method of claim 9, wherein the semiconductor fins include inner end portions adjoining the semiconductor pillar, further including directionally etching the inner end portions of the semiconductor fins down to the bottom dielectric layer.

13. The method of claim 9, wherein each of the semiconductor fins includes an inner end portion adjoining the semiconductor pillar, an outer end portion, and a body portion between the inner end portion and the outer end portion, further including:
   providing a patterned mask over the semiconductor fins, the patterned mask including a first opening exposing a first set of outer end portions of the semiconductor fins on a first side of the semiconductor pillar, a second opening exposing a second set of outer end portions of the semiconductor fins on a second side of the semiconductor pillar, and a third opening exposing the inner end portions of the semiconductor fins and the semiconductor pillar, and
   directionally etching the first set of outer end portions of the semiconductor fins on the first side of the semiconductor pillar, the second set of outer end portions of the semiconductor fins on the second side of the semiconductor pillar, and the inner end portions of the semiconductor fins down to the first dielectric layer.

14. The method of claim 1, wherein the semiconductor pillar consists essentially of germanium and the semiconductor fins consist essentially of group III-V semiconductor material.

* * * * *